(12) United States Patent
Lee

(10) Patent No.: US 9,165,646 B2
(45) Date of Patent: Oct. 20, 2015

(54) RESISTIVE MEMORY DEVICE INCLUDING COMPENSATION RESISTIVE DEVICE AND METHOD OF COMPENSATING RESISTANCE DISTRIBUTION

(71) Applicant: Jae-Kyu Lee, Yongin-si (KR)

(72) Inventor: Jae-Kyu Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 81 days.

(21) Appl. No.: 14/047,537

(22) Filed: Oct. 7, 2013

(65) Prior Publication Data

US 2014/0098592 A1   Apr. 10, 2014

(30) Foreign Application Priority Data

Oct. 8, 2012   (KR) .................. 10-2012-0111519

(51) Int. Cl.

| | |
|---|---|
| *G11C 11/15* | (2006.01) |
| *G11C 13/00* | (2006.01) |
| *G11C 11/16* | (2006.01) |
| *G11C 5/04* | (2006.01) |
| *G11C 11/00* | (2006.01) |
| *G11C 16/04* | (2006.01) |

(52) U.S. Cl.
CPC .............. *G11C 13/004* (2013.01); *G11C 11/16* (2013.01); *G11C 13/0004* (2013.01); *G11C 13/0007* (2013.01); *G11C 13/0064* (2013.01); *G11C 13/0069* (2013.01); *G11C 5/04* (2013.01); *G11C 11/005* (2013.01); *G11C 16/0433* (2013.01); *G11C 2013/0076* (2013.01); *G11C 2013/0078* (2013.01); *G11C 2213/32* (2013.01); *G11C 2213/79* (2013.01)

(58) Field of Classification Search
CPC . G11C 13/0004; G11C 13/0007; G11C 11/16
USPC ......................................... 365/148, 158, 163
See application file for complete search history.

(56) References Cited

U.S. PATENT DOCUMENTS

| | | | |
|---|---|---|---|
| 6,466,474 B1 * | 10/2002 | Liu et al. ...................... 365/149 |
| 6,480,438 B1 | 11/2002 | Park | |
| 6,937,505 B2 * | 8/2005 | Morikawa ..................... 365/158 |
| 7,453,747 B2 | 11/2008 | Abraham et al. | |
| 7,548,450 B2 | 6/2009 | Aoki | |

(Continued)

FOREIGN PATENT DOCUMENTS

| | | |
|---|---|---|
| JP | 2004030822 | 1/2004 |
| JP | 2009094226 | 4/2009 |
| KR | 100546177 | 1/2006 |

*Primary Examiner* — Son Mai
(74) *Attorney, Agent, or Firm* — Volentine & Whitt, PLLC

(57) ABSTRACT

A resistive memory device includes a memory cell array, an input/output (I/O) sense amplifier unit, an address input buffer, a row decoder, and a column decoder. The memory cell array includes unit memory cells, and operates in response to a word line driving signal and a column selecting signal, each unit memory cell includes a resistive device and a compensation resistive device. The I/O sense amplifier unit amplifies data output from the memory cell array to generate first data, and transfers input data to the memory cell array. The address input buffer generates a row address signal and a column address signal based on an external address. The row decoder decodes the row address signal and generates the word line driving signal based on the decoded row address signal. The column decoder decodes the column address signal and generates the column selecting signal based on the decoded column address signal.

20 Claims, 14 Drawing Sheets

(56) References Cited

U.S. PATENT DOCUMENTS

| | | |
|---|---|---|
| 8,036,015 B2 | 10/2011 | Ueda et al. |
| 8,040,723 B2 | 10/2011 | Sheu et al. |
| 8,076,195 B2 | 12/2011 | Liu et al. |
| 8,102,729 B2 | 1/2012 | Lee et al. |
| 2006/0215439 A1* | 9/2006 | Bill et al. .................. 365/148 |
| 2010/0061141 A1 | 3/2010 | Hwang |
| 2010/0220513 A1* | 9/2010 | Kim et al. .................. 365/148 |
| 2013/0329489 A1* | 12/2013 | Kim et al. .................. 365/158 |

* cited by examiner

RESISTIVE MEMORY DEVICE INCLUDING COMPENSATION RESISTIVE DEVICE AND METHOD OF COMPENSATING RESISTANCE DISTRIBUTION

CROSS-REFERENCE TO RELATED APPLICATION

A claim for priority under 35 U.S.C. §119 is made to Korean Patent Application No. 10-2012-0111519, filed on Oct. 8, 2012, in the Korean Intellectual Property Office, the entire contents of which are hereby incorporated by reference.

BACKGROUND

Embodiments of the inventive concept relate to a semiconductor memory device, and more particularly to a resistive memory device including a compensation resistive device.

Semiconductor memory devices, which are used to store data, may be classified as volatile semiconductor memory devices or nonvolatile semiconductor memory devices. A volatile semiconductor memory device may store data through charge or discharge of a capacitor. Generally, a volatile semiconductor memory device, such as a random access memory (RAM), stores or reads data when power is applied and loses data when the power supply is interrupted. A volatile semiconductor memory device is typically used as the main memory device of a computer.

A nonvolatile semiconductor memory device is able to store data even where the power supply is interrupted. A nonvolatile semiconductor memory device may be used to store programs and data for a wide range of applications, such as computers and portable communication devices.

Owing to the demand for fabrication of high-capacity low-power semiconductor memory devices, research has been conducted on advanced nonvolatile memory devices that do not require refresh operations. Currently, phase-change random access memories (RAMs) (PRAMs) using phase-change materials, resistive RAMs (RRAMs) using variable resistive materials, such as transition metal oxides, and magnetic RAMs (MRAMs) using ferromagnetic materials have attracted considerable attention as advanced memory devices. Advanced memory devices have variable resistances according to applied currents or voltages, and may not need refresh operations due to nonvolatile characteristics. Therefore, even when the currents or voltages are no longer applied, the advanced memory devices are able to maintain resistances.

SUMMARY

Embodiments of the inventive concept provide a resistive memory device capable of compensating for distribution of a resistive device included in a memory cell array, and capable of increasing sensing margin of data.

Embodiments of the inventive concept also provide a method of distribution compensation of a resistive memory device capable of compensating for distribution of a resistive device included in a memory cell array, and capable of increasing sensing margin of data.

In accordance with an aspect of the inventive concept, a resistive memory device includes a memory cell array, an input/output (I/O) sense amplifier unit, an address input buffer, a row decoder, and a column decoder. The memory cell array includes unit memory cells, and operates in response to a word line driving signal and a column selecting signal, each of the unit memory cells includes a resistive device and a compensation resistive device. The I/O sense amplifier unit is configured to amplify data output from the memory cell array to generate first data, and to transfer input data to the memory cell array. The address input buffer is configured to generate a row address signal and a column address signal based on an external address. The row decoder is configured to decode the row address signal and to generate the word line driving signal based on the decoded row address signal. The column decoder is configured to decode the column address signal and to generate the column selecting signal based on the decoded column address signal.

The resistive device may include a top electrode, a bottom electrode, and a transition metal oxide disposed between the top electrode and the bottom electrode. Alternatively, the resistive device may include a top electrode, a bottom electrode, and phase-change material disposed between the top electrode and the bottom electrode. Alternatively, the resistive device may include a free layer comprising a first ferromagnetic material, a pinned layer comprising of a second ferromagnetic material, and a tunnel barrier layer disposed between the free layer and the pinned layer.

The memory cell array may include a plurality of word lines and a plurality of bit lines, the unit memory cells being disposed between respective word lines and respective bit lines. The I/O sense amplifier unit may include a selection circuit configured to selectively connect the bit lines of the memory cell array to a first node in response to the column selecting signal, a sense amplifier configured to amplify a difference between a voltage signal of the first node and a reference voltage to generate first data, and a write driver configured to generate a first program current based on write data and to provide the first program current to the first node in a normal operating mode, and configured to generate a second program current based on the first data and to provide the second program current to the first node in a test mode.

The I/O sense amplifier unit may further include a switch configured to selectively connect the first node to the sense amplifier and the write driver.

The write driver may be configured to compare the first data with a target value to determine a magnitude of the second program current.

The unit memory cell may include a cell transistor having a gate connected to a word line and a source connected to a source line. The resistive device and the compensation resistive device may be connected in series to each other, and may be coupled between a drain of the cell transistor and a bit line.

The memory cell array may include a plurality of word lines and a plurality of bit lines, the unit memory cells being disposed between respective word lines and respective bit lines. The I/O sense amplifier unit may include a selection circuit configured to selectively connect the bit lines of the memory cell array to a first node in response to the column selecting signal, a sense amplifier configured to amplify a difference between a voltage signal of the first node and a reference voltage to generate first data, and a write driver configured to generate a program current based on write data and to provide the program current to the first node in a normal operating mode, and configured to generate a program voltage based on the first data and to provide the program voltage to the compensation resistive device of a unit memory cell in a test mode.

The write driver may be configured to compare the first data with a target value to determine a magnitude of the program voltage.

The compensation resistive device may include a floating gate transistor. The write driver may be configured to change a magnitude of a threshold voltage (Vth) of the floating gate transistor according to the program voltage. The I/O sense amplifier unit may further include a first switch configured to selectively connect the first node to the sense amplifier and the write driver, and a second switch configured to selectively connect the write driver to the first switch and a control gate of the floating gate transistor.

The resistive memory device may further include an input/output (I/O) circuit configured to determine an output order of the first data and to perform a parallel-serial conversion to generate output data, and configured to buffer the input data to provide to the I/O sense amplifier unit The resistive memory device may be a stacked memory device in which a plurality of chips communicate data and control signals by a through-silicon-via (TSV).

In accordance with another aspect of the inventive concept, a method is provided for compensating resistance distribution of a resistive device included in a memory cell array. The method includes selecting a unit memory cell of the memory cell array, the memory cell including a resistive device and a compensation resistive device; reading data from the selected unit memory cell; determining whether the data read from the unit memory cell is equal to a target value; and when the read data is not equal to the target value, performing an offset write operation, and again performing the reading of the data from the selected unit memory cell. The offset write operation provides at least one of a program current and a program voltage to the selected unit memory cell in a test mode to adjust resistance of the compensation resistive device.

In accordance with another aspect of the inventive concept, a resistive memory device includes a memory cell array and an input/output (I/O) sense amplifier unit. The memory cell array includes a plurality of unit memory cells connected between a plurality of word lines and a plurality of bit lines, respectively, each unit memory cell comprising a cell transistor, a resistive device and a compensation resistive device, where the cell transistor has a gate connected to a corresponding word line of the plurality of word lines, and the resistive device and the compensation resistive device are connected in series between the cell transistor and a corresponding bit line of the plurality of bit lines. The I/O sense amplifier unit is configured to amplify data output from the memory cell array to generate first data, and to transfer input data to the memory cell array. Each compensation resistive device compensates a resistance distribution of a corresponding resistive device based on the first data, increasing an effective sensing margin of the resistive device.

BRIEF DESCRIPTION OF THE DRAWINGS

Embodiments of the inventive concept will be more clearly understood from the following detailed description taken in conjunction with the accompanying drawings, in which like reference numerals denote like elements throughout. The drawings are not necessarily to scale, emphasis instead being placed upon illustrating features of the various embodiments. In the drawings.

DETAILED DESCRIPTION OF THE EMBODIMENTS

Figure 1:
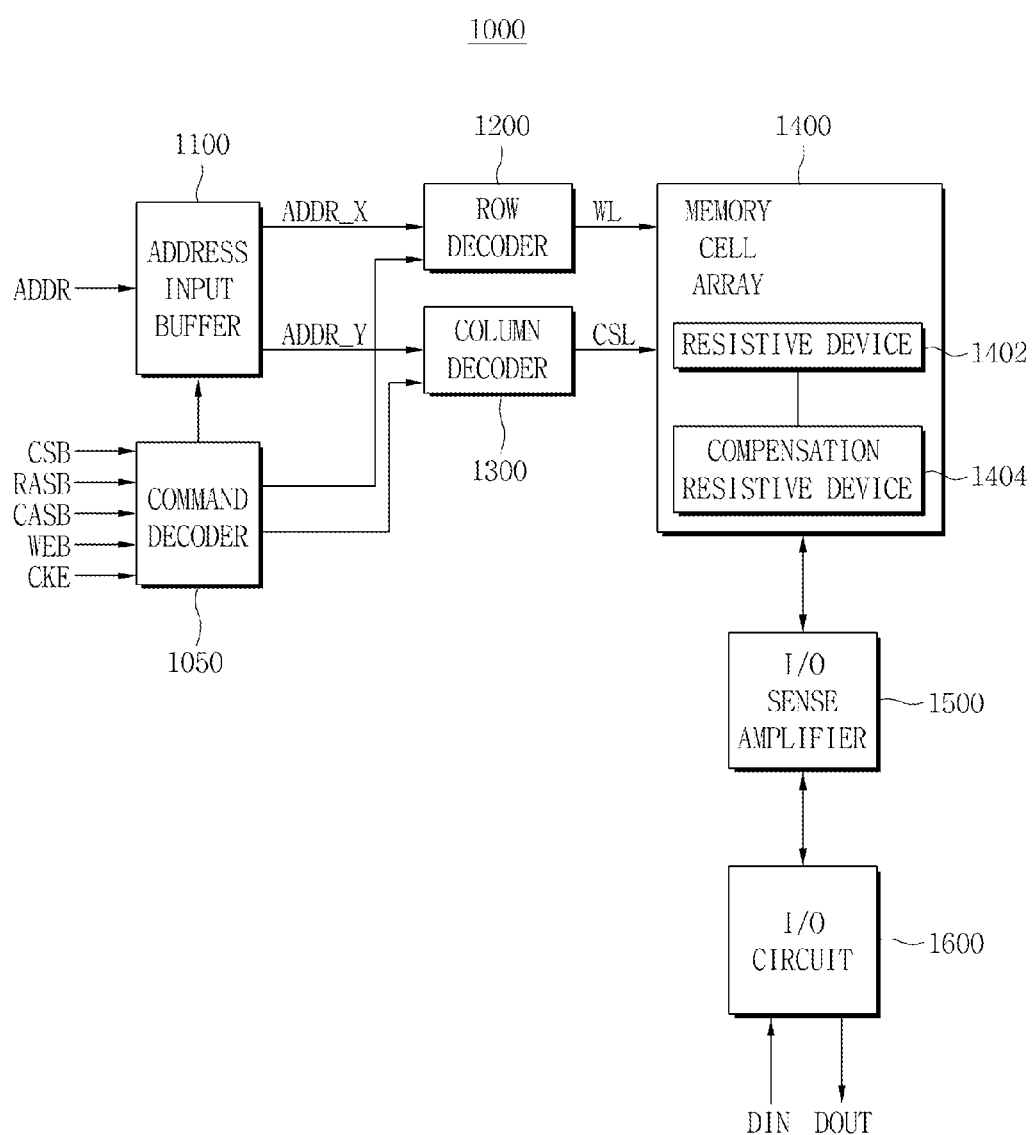
FIG. 1 is a block diagram of a resistive memory device, according to embodiments of the inventive concept.

The inventive concept will now be described more fully with reference to the accompanying drawings, in which exemplary embodiments of the inventive concept are shown. The inventive concept may, however, be embodied in many different forms and should not be construed as being limited to the embodiments set forth herein. Rather, these embodiments are provided so that this disclosure will be thorough and complete, and will fully convey the concept of the inventive concept to one of ordinary skill in the art. In some embodiments, well-known methods, procedures, components, and circuitry have not been described in detail to avoid unnecessarily obscuring aspects of the present invention.

Accordingly, while the inventive concept is susceptible to various modifications and may take on various alternative forms, specific embodiments thereof are shown by way of example in the drawings and will herein be described in detail. It should be understood, however, that there is no intent to limit the inventive concept to the particular forms disclosed. On the contrary, the inventive concept is to cover all modifications, equivalents, and alternatives falling within the spirit and scope of the claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the inventive concept.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein to describe embodiments of the inventive concept is not intended to limit the scope of the inventive concept. The articles "a," "an," and "the" are singular in that they have a single referent, however the use of the singular form in the present document should not preclude the presence of more than one referent. In other words, elements of the inventive concept referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/acts noted in the blocks may occur out of the order indicated in the flowcharts. For example, two blocks shown in succession may in fact be executed substantially concurrently or the blocks may sometimes be executed in the reverse order, depending upon the functionality/acts involved.

The inventive concept will now be described more fully with reference to the accompanying drawings, in which embodiments of the inventive concept are shown.

FIG. 1 is a block diagram of a resistive memory device, according to embodiments of the inventive concept.

Referring to FIG. 1, a resistive memory device 1000 includes a command decoder 1050, an address input buffer 1100, a row decoder 1200, a column decoder 1300, a memory cell array 1400, an input/output (I/O) sense amplifier unit 1500 and an I/O circuit 1600.

The command decoder 1050 decodes a chip selecting signal CSB, a row address strobe signal RASB, a column address strobe signal CASB, a write enable signal WEB, and a clock enable signal CKE to generate various control signals for controlling circuit blocks included in the resistive memory device 1000.

The memory cell array 1400 includes a plurality of unit memory cells (resistive memory cell), each including a resistive device 1402 and a compensation resistive device 1404, and operates in response to a word line driving signal WL and a column selecting signal CSL. The address input buffer 1100 generates a row address signal ADDR_X and a column address signal ADDR_Y based on an external address ADDR. The row decoder 1200 decodes the row address signal ADDR_X and generates the word line driving signal WL based on the decoded row address signal. The column decoder 1300 decodes the column address signal ADDR_Y and generates the column selecting signal CSL based on the decoded column address signal.

The I/O sense amplifier unit 1500 amplifies data output from the memory cell array 1400 to generate first data, and transfers input data DIN to the memory cell array 1400. The I/O sense amplifier unit 1500 may be considered part of the memory cell array 1400. The I/O circuit 1600 determines an output order of the first data, and performs a parallel-serial conversion to generate output data DOUT, buffers the input data DIN and provides the buffered input data to the I/O sense amplifier unit 1500.

Figure 2:
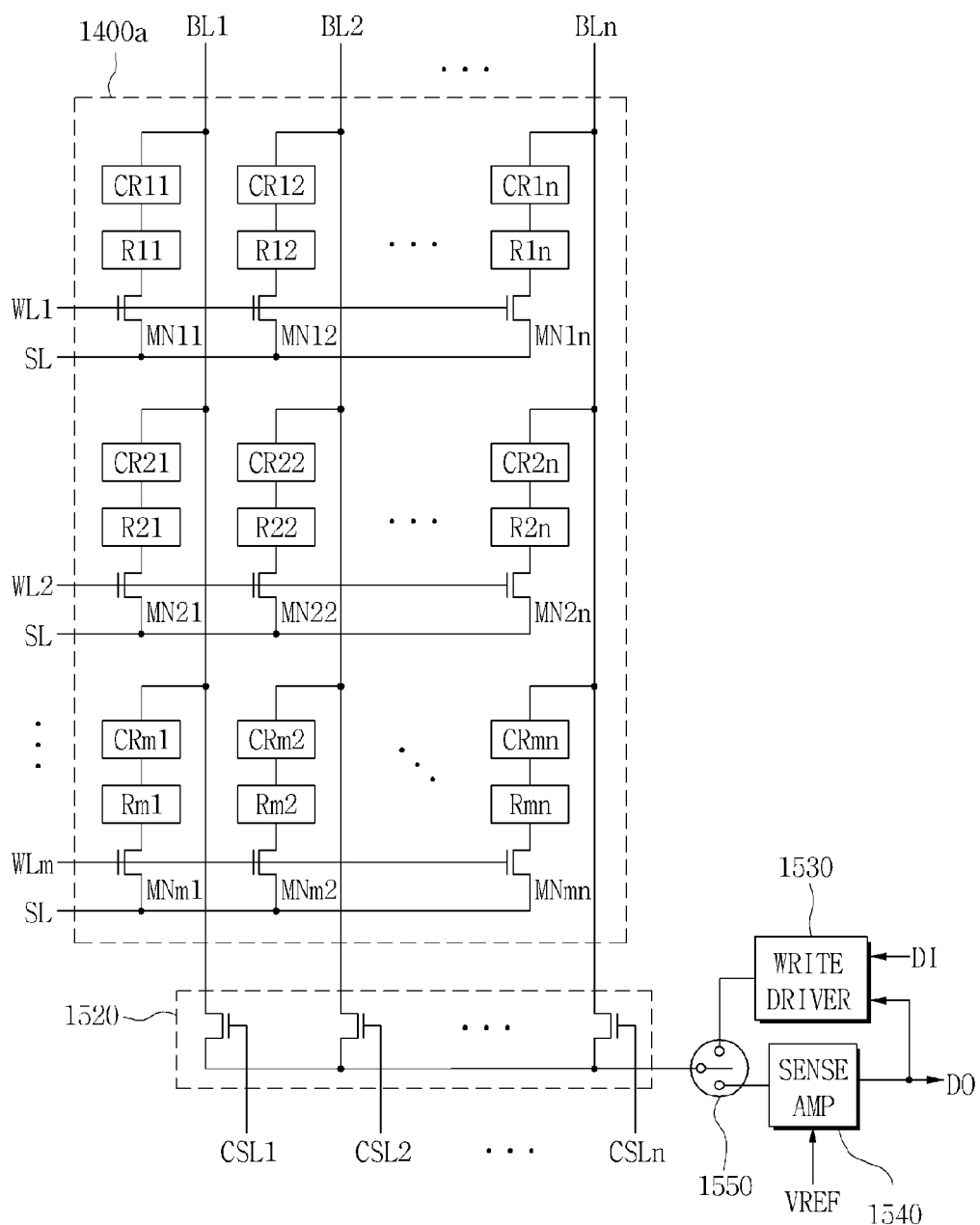
FIG. 2 is a circuit diagram of an example of a memory cell array and an input/output sense amplifier included in the resistive memory device of FIG. 1, according to an embodiment of the inventive concept.

FIG. 2 is a circuit diagram of an example of a memory cell array and an I/O sense amplifier included in the resistive memory device of FIG. 1, according to an embodiment of the inventive concept.

Referring to FIG. 2, the I/O sense amplifier unit 1500 includes a selection circuit 1520, a sense amplifier 1540, a write driver 1530, and a switch 1550. The memory cell array unit 1400a includes a plurality of word lines WL1 to WLm and a plurality of bit lines BL1 to BLn, and a unit memory cell is provided between each of the word lines WL1 to WLm and the corresponding one of the bit lines BL1 to BLn. Each unit memory cell includes a corresponding cell transistor (MN11 to MNmn), resistive device (R11 to Rmn) and compensation resistive device (CR11 to CRmn), as discussed below. The selection circuit 1520 selectively connects the bit lines BL1-BLn to a first node in response to column selection signals CSL1 to CSLn, respectively. The sense amplifier 1540 amplifies a difference between the first node and a reference voltage VREF, and generates first data DO. The write driver 1530 generates a first program current based on write data DI and provides the first program current to the first node during a normal operation mode. Further, the write driver 1530 generates a second program current based on the first data DO and provides the second program current to the first node during a test operation. For example, the write driver may compare the first data DO with a target value to determine a magnitude of the second program current. The switch 1550 selectively connects the first node to the sense amplifier 1540 and the write driver 1530.

The memory cell array unit 1400a includes cell transistors MN11 to MN1n having gates connected to the word line WL1, resistive devices R11 to R1n serially connected to each of the cell transistors MN11 to MN1n, and compensation resistive devices CR11 to CR1n serially connected between the resistive devices R11 to R1n and a corresponding one of the bit lines BL1 to BLn. Sources of the cell transistors MN11 to MN1n are connected to the source line SL. Further, the memory cell array unit 1400a include cell transistors MN21 to MN2n having gates connected to the word line WL2, resistive devices R21 to R2n serially connected to the cell transistors MN21 to MN2n, and compensation resistive devices CR21 to CR2n serially connected between the resistive devices R21 to R2n and a corresponding one of the bit lines BL1 to BLn. Sources of the cell transistors MN21 to MN2n are connected to the source line SL. Further, the memory cell array unit 1400a includes cell transistors MNm1 to MNmn having gates connected to the word line WLm, resistive devices Rm1 to Rmn serially connected to the cell transistors MNm1 to MNmn, compensation resistive devices CRm1 to CRmn serially connected between the resistive devices Rm1 to Rmn and a corresponding one of the bit lines BL1 to BLn. Sources of the cell transistors MNm1 to MNmn are connected to the source line SL.

Figure 3:
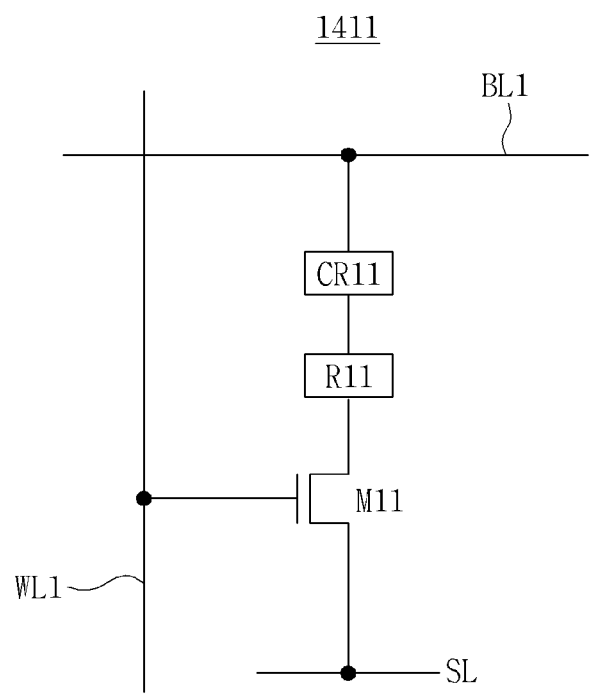
FIG. 3 is a circuit diagram illustrating an example of a unit memory cell constituting the resistive memory cell array of FIG. 2.

FIG. 3 is a circuit diagram illustrating an example of a unit memory cell constituting the resistive memory cell array unit 1400a of FIG. 2, according to an embodiment of the inventive concept.

Referring to FIG. 3, a unit memory cell 1411 includes a cell transistor M11 includes NMOS transistor, a resistive device R11 and a compensation resistive device CR11. The cell transistor M11 has a gate connected to the word line WL1 and a source connected to the source line SL. The resistive device R11 and the compensation resistive device CR11 are serially connected to each other, and are connected between the drain of the cell transistor M11 and the bit line BL1.

Figure 4:
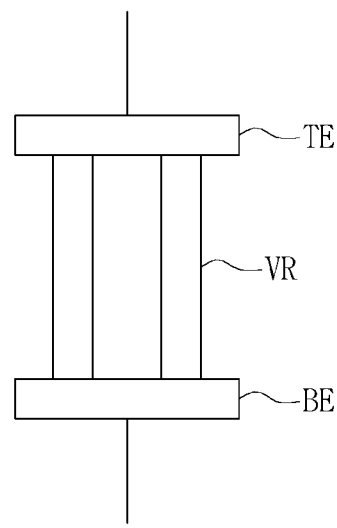
FIG. 4 is a diagram illustrating an example of a resistive device constituting the unit memory cell of FIG. 3.

FIG. 4 is a diagram illustrating an example of a resistive device R11 constituting the unit memory cell 1411 of FIG. 3.

Referring to FIG. 4, the resistive device R11 includes a top electrode TE, a bottom electrode BE, and a transition metal oxide VR disposed between the top electrode TE and the bottom electrode BE. The top electrode TE may include platinum (Pt) and the transition metal oxide VR may include cobalt oxide, for example.

Figure 5:
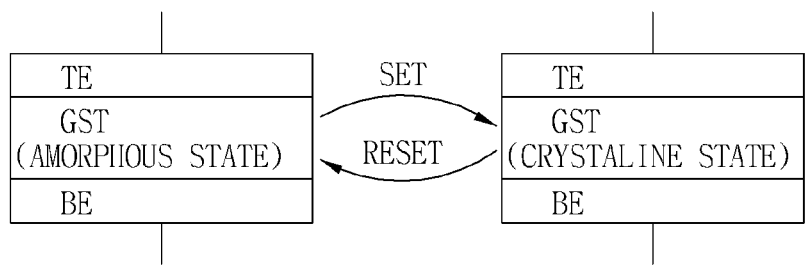
FIG. 5 is a diagram illustrating another example of a resistive device constituting the unit memory cell of FIG. 3.

FIG. 5 is a diagram illustrating another example of a resistive device R11 constituting the unit memory cell 1411 of FIG. 3.

Referring to FIG. 5, the resistive device R11 includes a top electrode TE, a bottom electrode BE, and a phase change material GST disposed between the top electrode TE and the bottom electrode BE. The phase change material GST is able to change to an amorphous state and to a crystalline state depending on temperature, and resistance of the phase change material GST varies according to the temperature and heating time. An example of the phase change material GST is Gex-SbyTez. The resistive device R11 may be set when the phase change material GST transitions from the amorphous state to the crystalline state, and reset when the phase change material GST transitions from the crystalline state to the amorphous state.

Figure 6:
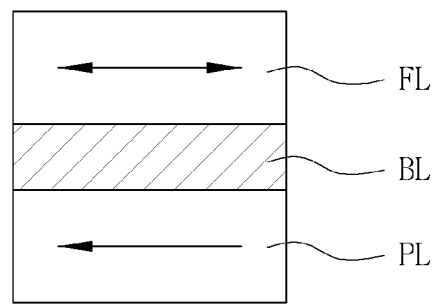
FIG. 6 is a diagram illustrating another example of a resistive device constituting the unit memory cell of FIG. 3.

FIG. 6 is a diagram illustrating still another example of a resistive device R11 constituting the unit memory cell 1411 of FIG. 3.

Referring to FIG. 6, the resistive device R11 includes a pinned layer (PL) having a predetermined pinned magnetization direction, a free layer (FL) magnetized in the direction of an externally applied magnetic field, and a tunnel barrier layer (BL) formed using an insulating film between the pinned layer PL and the free layer FL. To pin the magnetization direction of the pinned layer PL, the resistive device R11 may further include an anti-ferromagnetic layer (not shown). The resistive device R11 of FIG. 6 may be a magnetic tunnel junction (MTJ) element constituting a spin-transfer torque magneto-resistive random access memory (STT-MRAM), for example.

To enable a write operation of the STT-MRAM, the cell transistor MN11 may be turned on by applying a logic-high voltage to the word line WL1, and a write current may be applied between the bit line BL1 and the source line SL. To enable a read operation of the STT-MRAM, the cell transistor MN11 may be turned on by applying a logic-high voltage to the word line WL1, and a read current may applied from the bit line BL1 toward the source line SL so that data stored in the MTJ cell can be determined according to a measured resistance.

Figure 7:
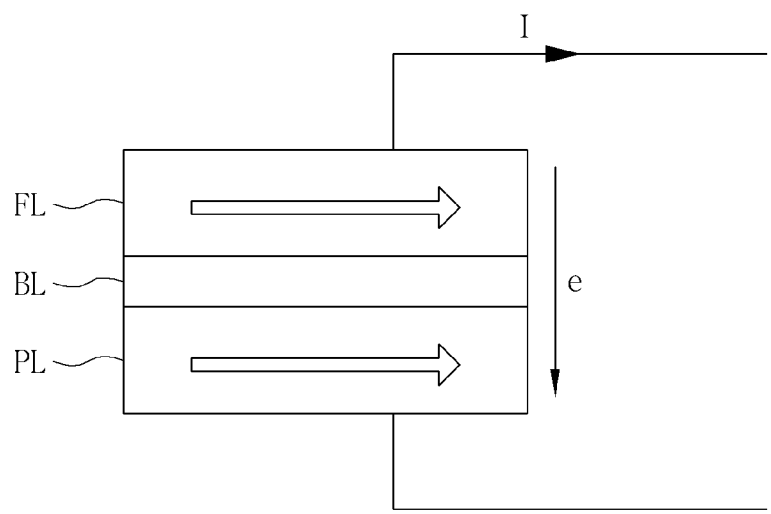
FIGS. 7 and 8 are diagrams showing magnetization directions of a magnetic tunnel junction (MTJ) element relative to written data, according to embodiments of the inventive concept.
Figure 8:
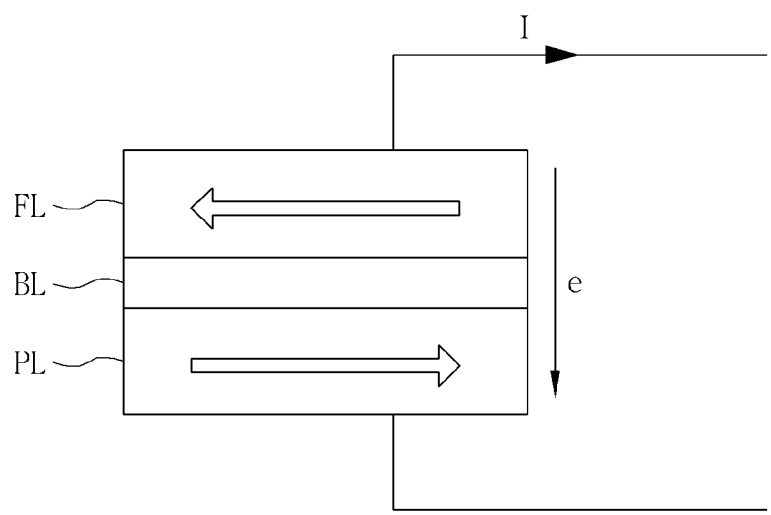

FIGS. 7 and 8 are diagrams showing magnetization directions of a magnetic tunnel junction (MTJ) element relative to written data. Resistance of the MTJ element may vary according to magnetization direction of the free layer FL. When a read current I is supplied to the MTJ element, a data voltage may be output according to the resistance of the MTJ element. Since the read current I has a much lower intensity than the write current, the magnetization direction of the free layer FL will not be shifted by the read current I.

Referring to FIG. 7, in the MTJ element, the magnetization direction of the free layer FL is parallel to the magnetization direction of the pinned layer PL. Accordingly, the MTJ element has low resistance, and data "0" may be read.

Referring to FIG. 8, in the MTJ element, magnetization of the free layer FL is anti-parallel to the magnetization direction of the pinned layer PL. Accordingly, the MTJ element has high resistance, and data "1" may be read.

Although FIGS. 7 and 8 illustrate that each of the free layer FL and the pinned layer PL of the MTJ cell is a horizontal magnetic element, each of the free layer FL and the pinned layer PL may be a vertical magnetic element in various alternative embodiments without departing from the scope of the present teachings.

Figure 9:
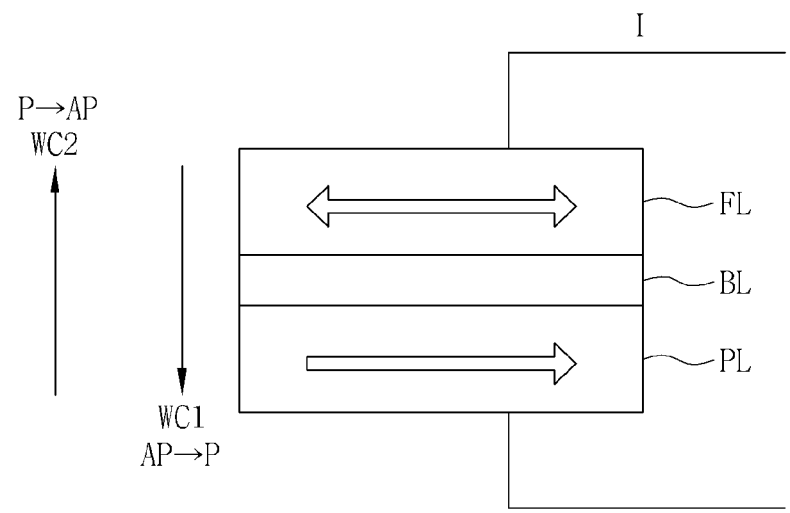
FIG. 9 is a diagram showing a write operation of the resistive memory device of FIG. 1 when a unit memory cell is a magnetoresistive memory cell, according to an embodiment of the inventive concept.

FIG. 9 is a diagram showing a write operation of the resistive memory device of FIG. 1 when a unit memory cell is a resistive memory cell.

Referring to FIG. 9, the magnetization direction of a free layer FL is determined according to directions of write currents WC1 and WC2 flowing through an MTJ element. For instance, when the first write current WC1 is applied, free electrons having the same spin direction as a pinned layer PL apply torque to the free layer FL. Thus, the free layer FL is magnetized parallel to the pinned layer PL (e.g., changing from anti-parallel (AP) to parallel (P)). When the second write current WC2 is applied, electrons having an opposite spin direction to the pinned layer PL apply torque to the free layer FL. As a result, the free layer FL is magnetized anti-parallel to the pinned layer PL (e.g., changing from parallel (P) to anti-parallel (AP)). That is, in an MTJ cell, the magnetization direction of the free layer FL may be shifted due to spin-transfer torque (STT).

Figure 10:
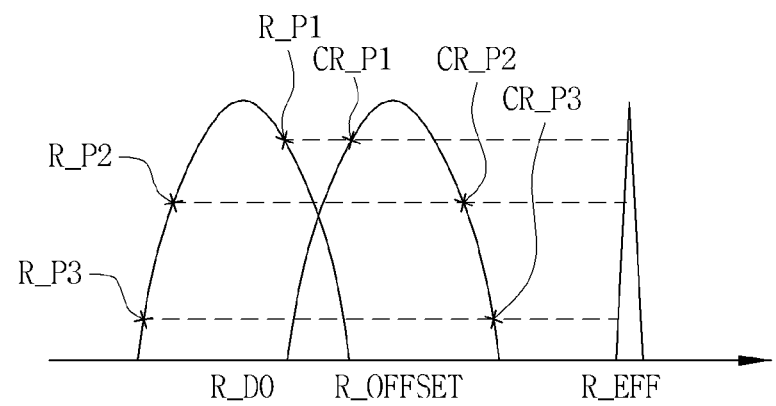
FIG. 10 is a diagram illustrating a method of compensating distribution of a resistive device included in the memory cell array of FIG. 2, according to an embodiment of the inventive concept.

FIG. 10 is a diagram illustrating a method of compensating distribution of a resistive device included in the memory cell array unit 1400a of FIG. 2, according to an embodiment.

In FIG. 2, distance from each of the resistive devices included in the memory cell array unit 1400a to the sense amplifier 1540 may not be the same, and resistive distribution of the resistive devices themselves may not be the same. Therefore, the sensing margin of the sense amplifier 1540 for sensing output data may be decreased. The memory cell array unit 1400a of FIG. 2 may decrease the resistance distribution of each of the resistive memory cells included in the memory cell array unit 1400a sensed in an input terminal of the sense amplifier 1540 because the memory cell array unit 1400a includes the compensation resistive devices CR serially connected to the resistive devices R.

In FIG. 10, R_D0 denotes resistance distribution of a resistive device, and R_OFFSET denotes resistance distribution of a corresponding compensation resistive device for substantially cancelling resistance deviation between resistive devices. Further, R_EFF denotes effective resistance measured at the input terminal of the sense amplifier 1540 after the resistance deviation between the resistive devices is substantially cancelled.

In FIG. 10, it may be noted that the distribution of resistance R_P1 is substantially cancelled by compensation resistance CR_P1, the distribution of R_P2 is substantially cancelled by compensation resistance CR_P2, and the distribution of R_P3 is substantially cancelled by compensation resistance CR_P3. Accordingly, referring to FIG. 10, distribution of effective resistance of the resistive devices included in the memory cell array unit 1400*a* of the resistive memory device 1000 is near "0".

Figure 11:
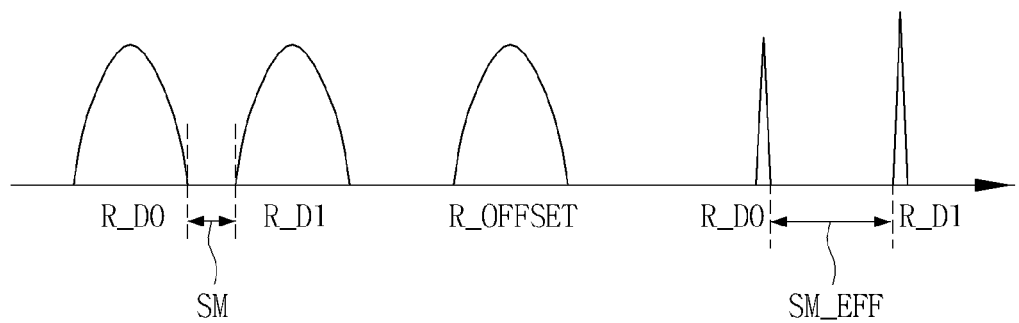
FIG. 11 is a diagram illustrating a sensing margin of a resistive device included in the memory cell array of FIG. 2 before and after resistance distribution is compensated, according to embodiments of the inventive concept.

FIG. 11 is a diagram illustrating a sensing margin of a resistive device included in the memory cell array unit 1400*a* of FIG. 2 before and after compensation for resistance distribution, according to an embodiment.

Referring to FIG. 11, it may be noted that the sensing margin SM, which is the resistance value between resistance R_D0 of data "0" and resistance R_D1 of data "1", is increased to an effective sensing margin SM_EFF by the resistance R_OFFSET of a compensation resistor.

Figure 12:
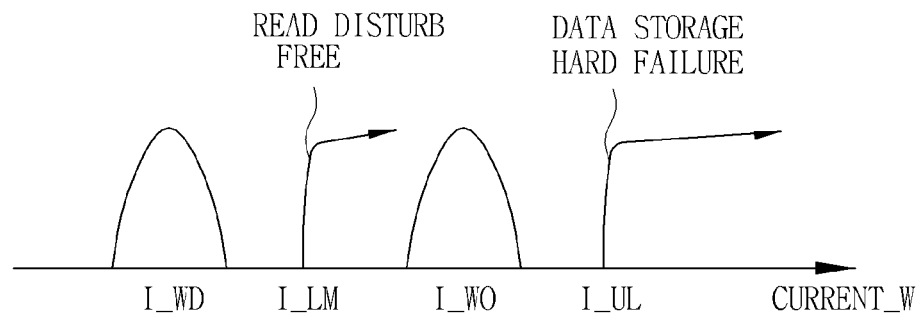
FIG. 12 is a diagram illustrating range of a magnitude of a write current for programming a compensation resistive device to compensate distribution of a resistive device included in the memory cell array of FIG. 2, according to embodiments of the inventive concept.

FIG. 12 is a diagram illustrating a range of magnitude of a write current for programming a compensation resistive device to compensate distribution of a resistive device included in the memory cell array of FIG. 2, according to an embodiment.

Referring to FIG. 12, a write current for programming the compensation resistive device to compensate for the distribution of the resistive device has values between I_LM and I_UL. The lower limit of the magnitude of the write current for programming the compensation resistive device is not affected by a write current of the resistive device, and may be determined so that the read operation of the resistive device is not affected by the write current for programming the compensation resistive device. Further, the upper limit of the magnitude of the write current for programming the compensation resistive device may be determined so that the current for programming the compensation resistive device does not breakdown the resistive device.

The compensation resistive device may be fabricated using a transition metal oxide used in a RRAM device, or a phase-change material such as GST, used in PRAM device, for example.

Figure 13:
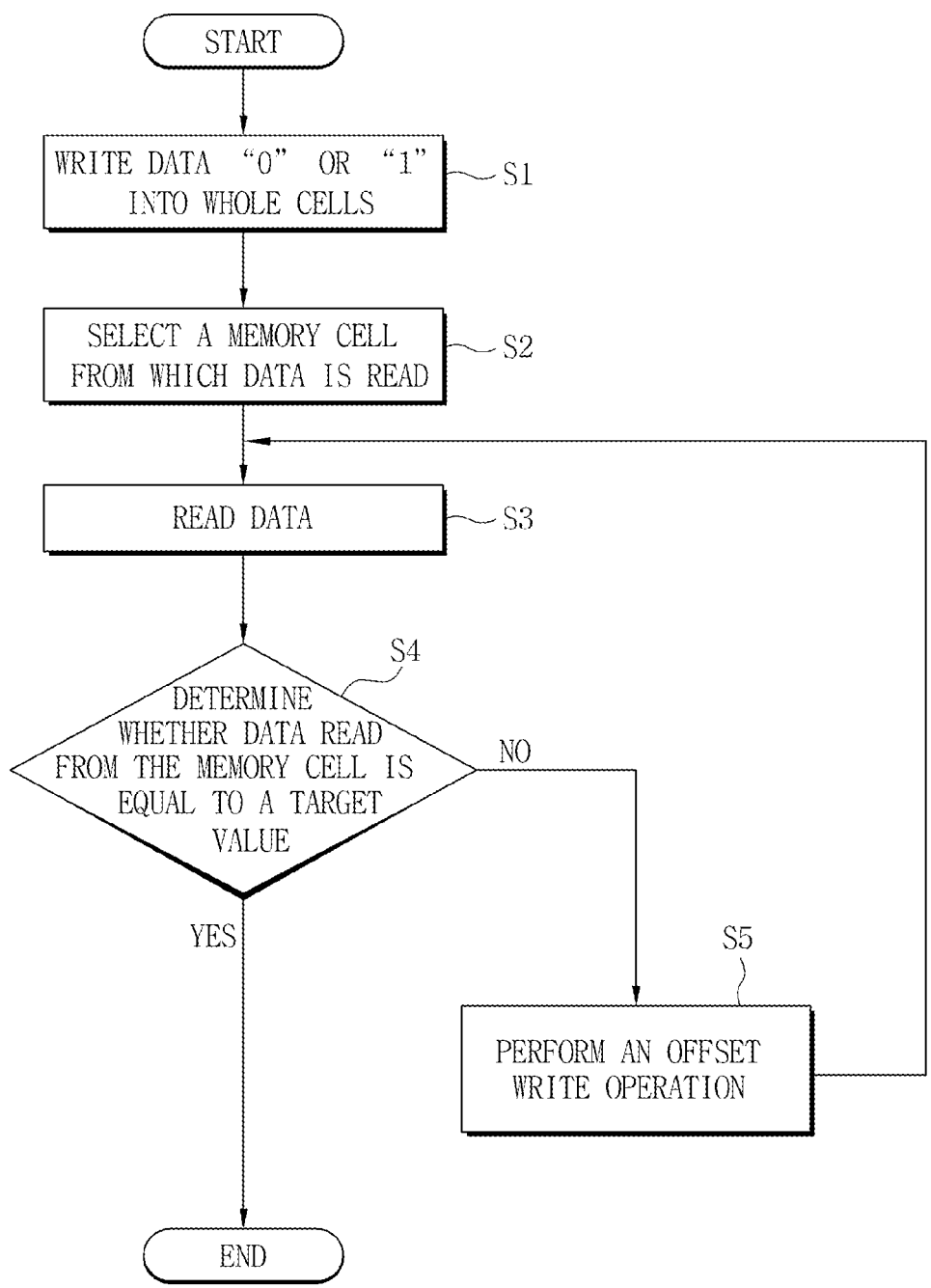
FIG. 13 is a flowchart illustrating a method of compensating resistance distribution of a resistive device included in the memory cell array, according to embodiments of the inventive concept.

FIG. 13 is a flowchart illustrating a method of compensating resistance distribution of a resistive device included in a memory cell array, according to embodiments of the inventive concept.

Referring to FIG. 13, the method of compensating resistance distribution of a resistive device included in the memory cell array may include the following operations:

(1) writing data "0" or "1" into whole cells (S1);
(2) selecting a memory cell from which data is read (S2);
(3) reading data (S3);
(4) determining whether data read from the memory cell is equal to a target value (S4);
(5) ending the process when the read data is equal to the target value, and performing an offset write operation (S5), and then performing the operation of S3 again, when the read data is not equal to the target value; and
(6) repeating the operations of S4.

The offset write operation represents an operation that provides a program current and/or a program voltage to resistive memory cells in a test mode to adjust resistances of compensation resistive devices.

Figure 14:
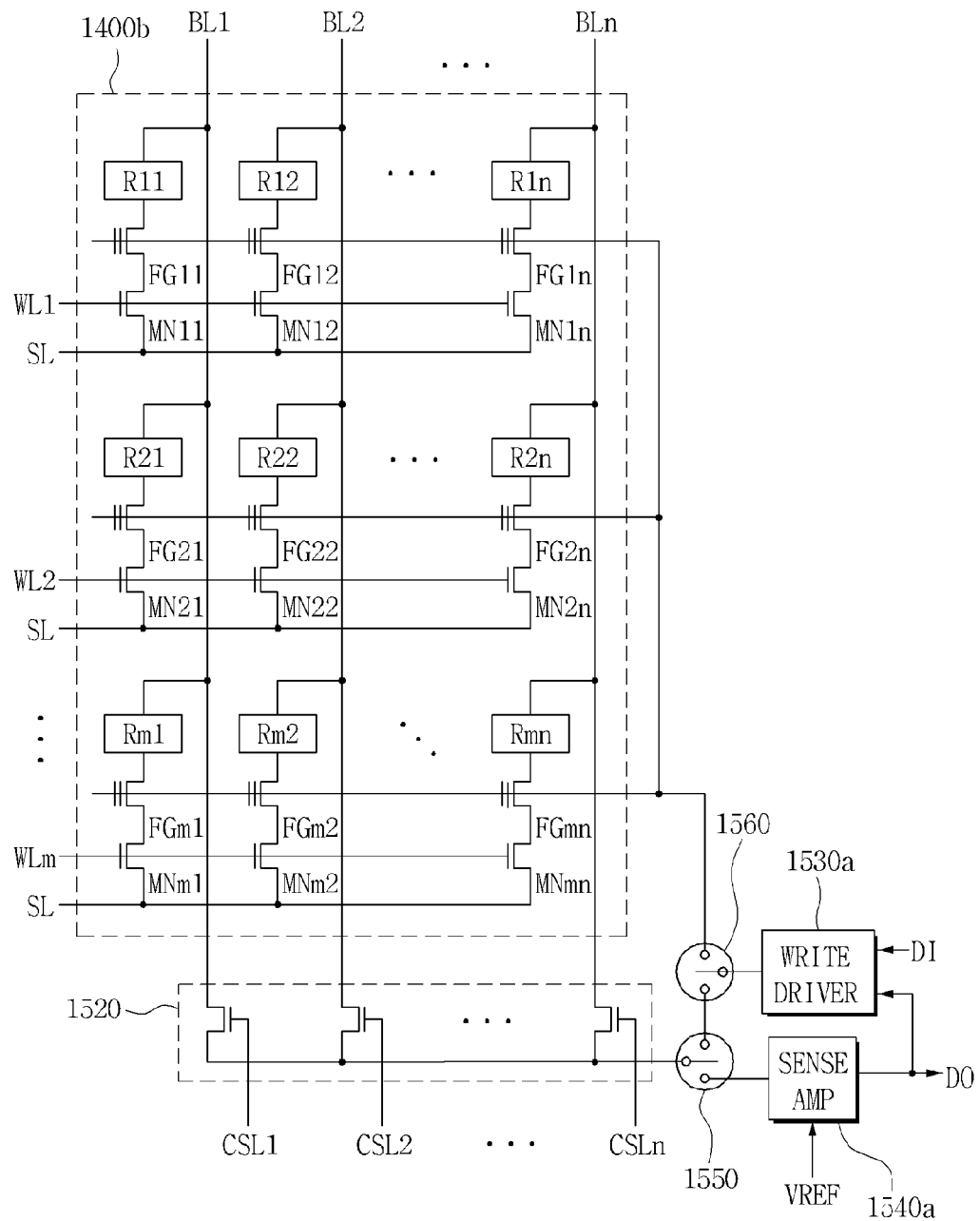
FIG. 14 is a circuit diagram of another example of a resistive memory cell array and an input/output sense amplifier included in the resistive memory device of FIG. 1, according to an embodiment of the inventive concept.

FIG. 14 is a circuit diagram of another example of a memory cell array 1400 and an I/O sense amplifier unit 1500 included in the resistive memory device 1000 of FIG. 1, according to an embodiment of the inventive concept. The I/O sense amplifier unit 1500 includes a selection circuit 1520, a sense amplifier 1540*a*, a write driver 1530*a*, a first switch 1550 and a second switch 1560.

Referring to FIG. 14, a memory cell array unit 1400*b* includes a plurality of word lines WL1 to WLm and a plurality of bit lines BL1 to BLn, and unit memory cells provided between each of the word lines WL1 to WLm and a corresponding one of the bit lines BL1 to BLn. The selection circuit 1520 selectively connects the bit lines BL1-BLn to a first node in response to column selection signals CSL1 to CSLn. The sense amplifier 1540*a* amplifies a difference between the first node and a reference voltage VREF, and generates first data DO. The write driver 1530*a* generates a program current based on write data DI and provides the program current to the first node during a normal operation. Further, the write driver 1530*a* generates a program voltage based on the first data DO and provides the program voltage to a compensation resistive device during a test operation.

More particularly, the write driver 1530*a* compares the first data DO with a target value to determine a magnitude of the program voltage. In the depicted embodiment, the compensation resistive devices include floating gate transistors (e.g., floating gate transistors FG11 to FGmn). The write driver 1530*a* changes a magnitude of a threshold voltage (Vth) of the floating gate transistor according to the program voltage.

The first switch 1550 selectively connects the first node to the sense amplifier 1540*a* and the write driver 1530*a*. The second switch 1560 selectively connects the write driver 1530*a* to the first switch 1550 and a control gate of the floating gate transistor.

More particularly, the memory cell array unit 1400*b* includes cell transistors MN11 to MN1n having gates connected to the word line WL1, floating gate transistors FG11 to FG1n serially connected to each of the cell transistors MN11 to MN1n, and resistive devices R11 to R1n serially connected between the floating gate transistors FG11 to FG1n and a corresponding one of the bit lines BL1 to BLn. Sources of the cell transistors MN11 to MN1n are connected to the source line SL. Further, the memory cell array unit 1400*b* includes cell transistors MN21 to MN2n having gates connected to the word line WL2, floating gate transistors FG21 to FG2n serially connected to each of the cell transistors MN21 to MN2n, and resistive devices R21 to R2n serially connected between the floating gate transistors FG21 to FG2n and a corresponding one of the bit lines BL1 to BLn. Sources of the cell transistors MN21 to MN2n are connected to the source line SL. Further, the memory cell array unit 1400*a* includes cell transistors MNm1 to MNmn having gates connected to the word line WLm, floating gate transistors FGm1 to FGmn serially connected to each of the cell transistors MNm1 to MNmn, and resistive devices Rm1 to Rmn serially connected between the floating gate transistors FGm1 to FGmn and a corresponding one of the bit lines BL1 to BLn. Sources of the cell transistors MNm1 to MNmn are connected to the source line SL.

Hereinafter, the operation of the resistive memory device having the structure of FIG. 14 will be described.

The resistive memory device of FIG. 14 may maintain the same resistance values with respect to paths from each of the resistive memory cells having a resistive device R in the memory cell array unit 1400b to the sense amplifier 1540a by changing a magnitude of a threshold voltage (Vth) of a corresponding floating gate transistor according to a program voltage generated by the write driver 1530a. Therefore, the sensing margin of the sense amplifier 1540a to sense output data is increased. The memory cell array unit 1400b of FIG. 14 decreases distribution of resistance of each of the resistive unit memory cells included in the memory cell array unit 1400b sensed at an input terminal of the sense amplifier 1540a because each unit memory cell of the memory cell array unit 1400b includes a floating gate transistor FG serially connected to a corresponding resistive device R.

In a normal operating mode, the write driver 1530a generates a program current based on write data DI, and provides the program current to the first node.

In a test mode, the write driver 1530a generates a program voltage based on the first data DO generated by the sense amplifier 1540a, and provides the program voltage to the floating gate transistors FG, which are compensation resistive devices included in the unit memory cells. When the program voltage is applied to a unit memory cell selected by the word line driving signal WL and the column selecting signal CSL, the magnitude of a threshold voltage Vth of a floating gate transistor FG included in the unit memory cell is changed. For example, the magnitude of a threshold voltage of the floating gate transistor included in a resistive unit memory cell having high parasitic resistance may be decreased, and the magnitude of a threshold voltage of a floating gate transistor included in a resistive unit memory cell having low parasitic resistance may be increased.

Figure 15:
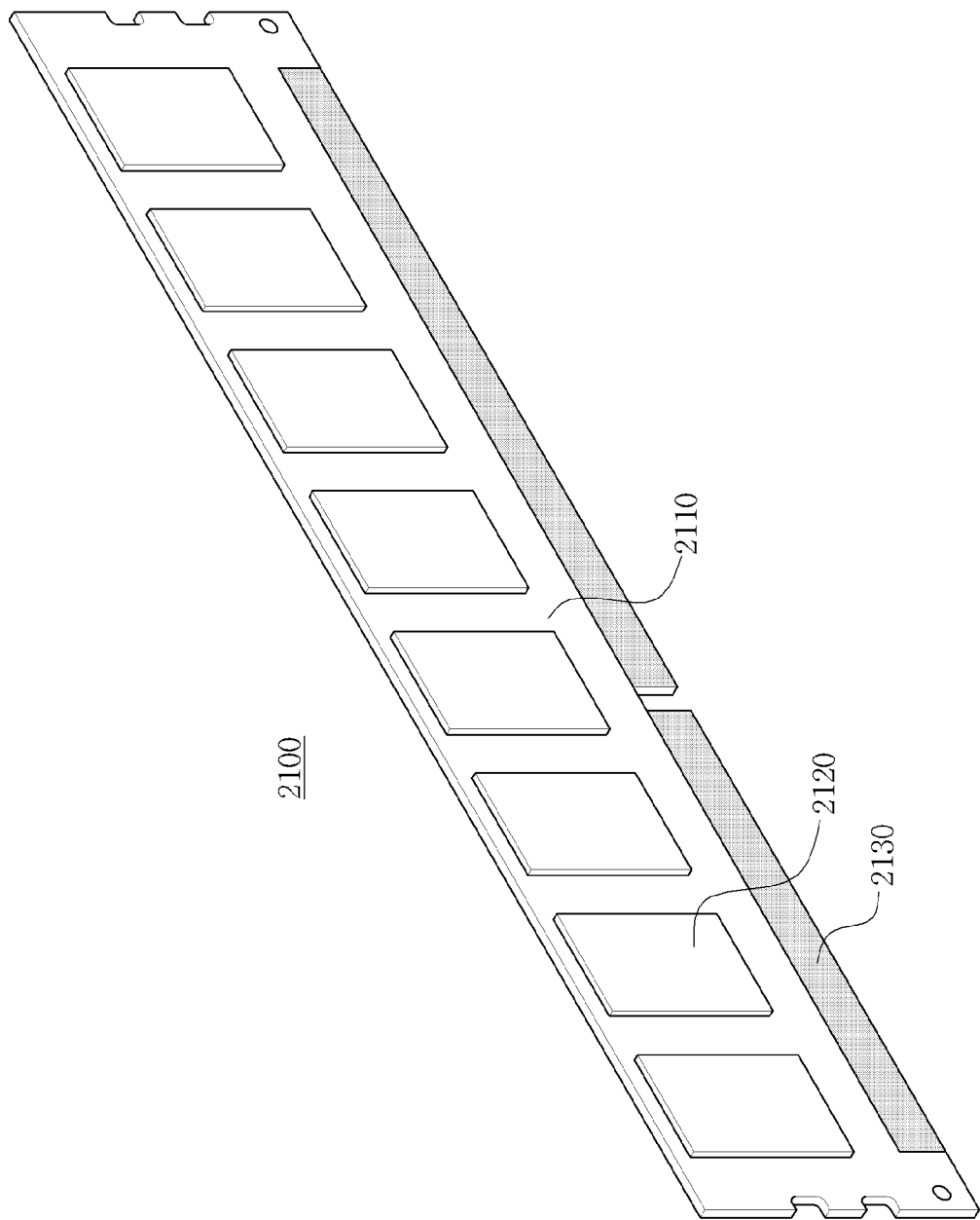
FIG. 15 is a diagram of a memory module including resistive memory devices, according to embodiments of the inventive concept.

FIG. 15 is a diagram of a memory module including resistive memory devices, according to embodiments of the inventive concept.

Referring to FIG. 15, a memory module 2100 includes a printed circuit board (PCB) 2110, multiple MRAM chips 2120, and a connector 2130. The MRAM chips 2120 may be bonded to top and bottom surfaces of the PCB 2110. The connector 2130 may be electrically connected to the MRAM chips 2120 through conductive lines (not shown). Also, the connector 2130 may be connected to a slot of an external host.

Figure 16:
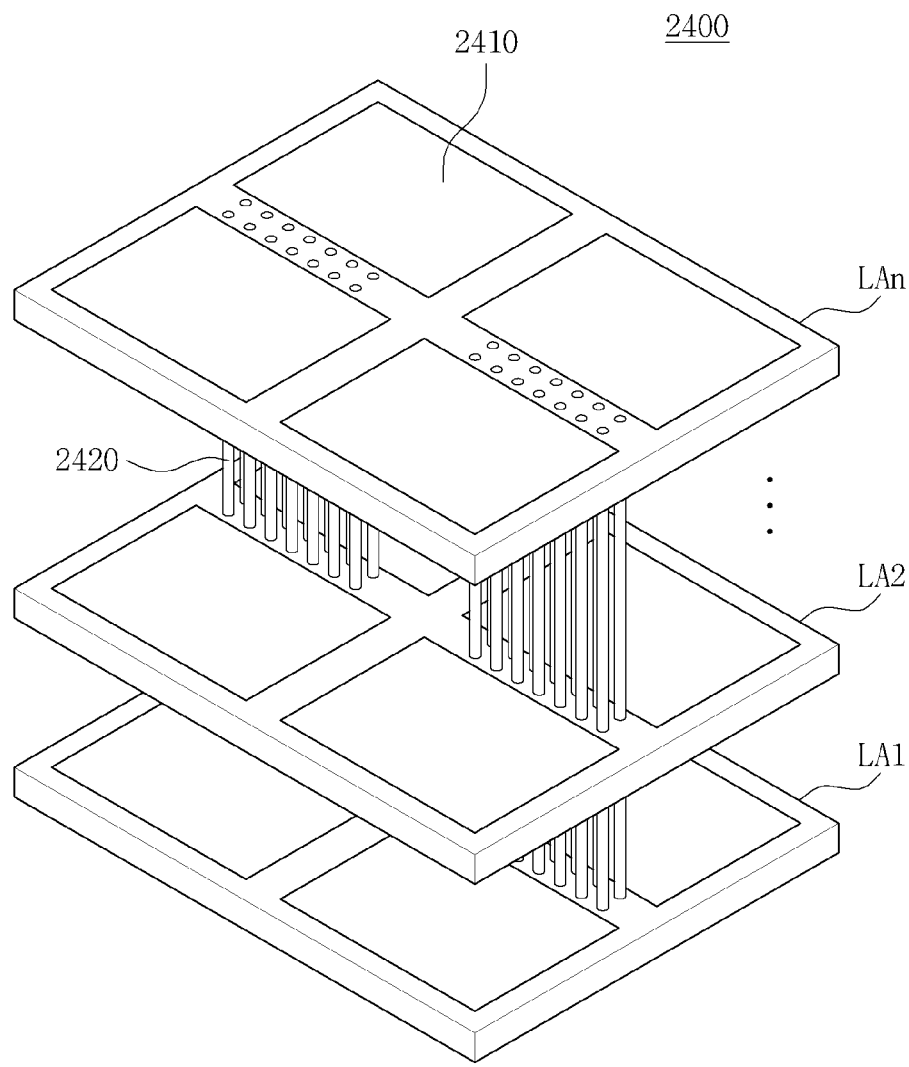
FIG. 16 is a simplified perspective view of a semiconductor device having a stack structure including a resistive memory device, according to embodiments of the inventive concept.

FIG. 16 is a simplified perspective view of a semiconductor device having a stack structure including a resistive memory device according to embodiments of the inventive concept.

In the memory module 2100 of FIG. 15, each of the memory chips may include multiple semiconductor layers LA1 to LAn. In the stack semiconductor device 2400, the stacked semiconductor layers LA1 to LAn are connected to one another through through-silicon vias (TSVs) 2420. Each of the semiconductor layers LA1 to LAn includes cell arrays 2410 including STT-MRAM cells, for example.

Figure 17:
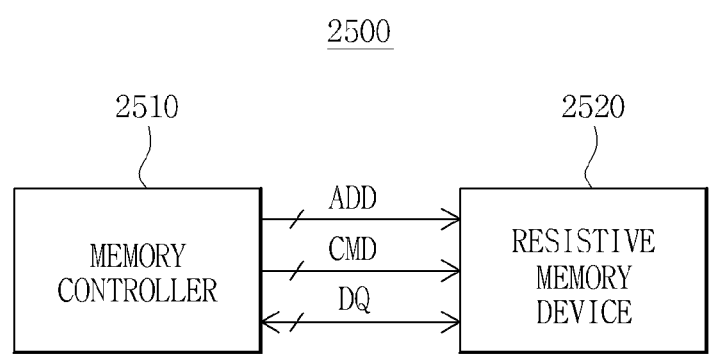
FIG. 17 is a block diagram of an example of a memory system including a resistive memory device, according to embodiments of the inventive concept.

FIG. 17 is a block diagram of an example of a memory system including a resistive memory device, according to an embodiment of the inventive concept.

Referring to FIG. 17, a memory system 2500 includes a memory controller 4510 and a resistive memory device 2520.

The memory controller 2510 may generate an address signal ADD and a command CMD, and provide the address signal ADD and the command CMD to the resistive memory device 2520 through buses. Data DQ may be transmitted from the memory controller 2510 to the resistive memory device 2520 through the buses, or transmitted from the resistive memory device 2520 to the memory controller 2510 through the buses. The resistive memory device 2520 may be a resistive memory device 1000, according to an embodiment of the inventive concept, and may include resistive devices and compensation resistive devices, as discussed above.

Figure 18:
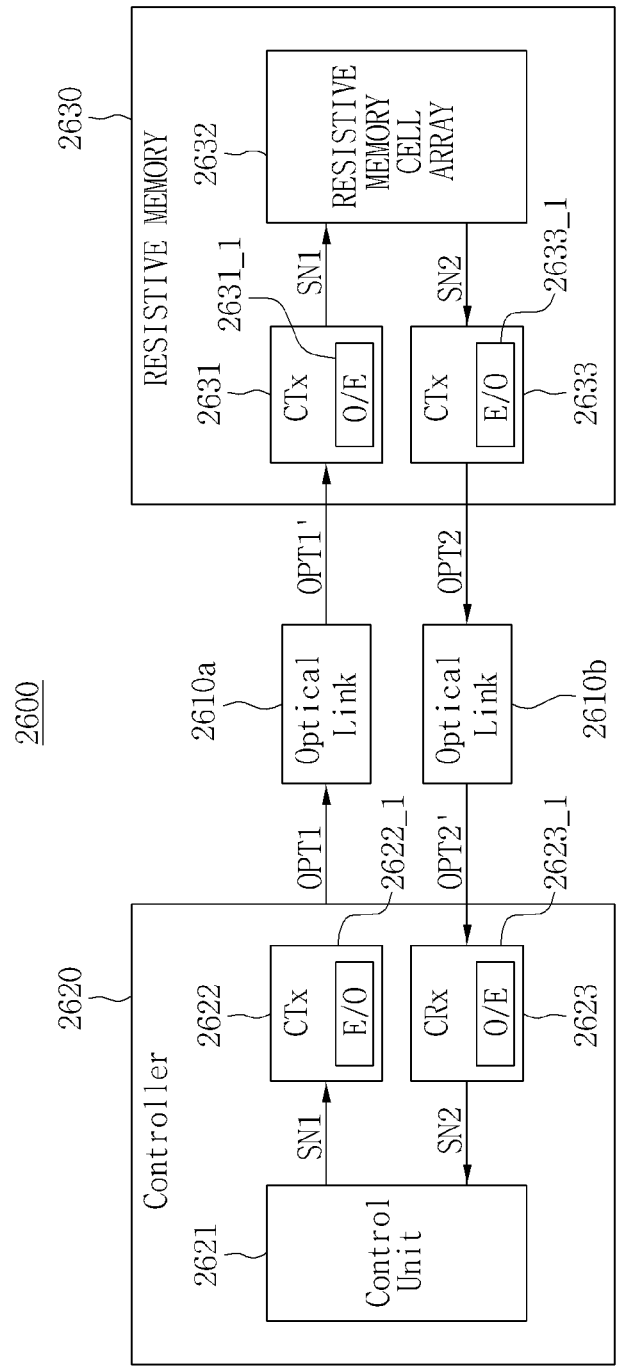
FIG. 18 is a block diagram of an example of a memory system including a resistive memory device and an optical link, according to an embodiment of the inventive concept.

FIG. 18 is a block diagram of an example of a memory system including a resistive memory device and an optical link, according to an embodiment of the inventive concept.

Referring to FIG. 18, a memory system 2600 includes a controller 2620, a resistive memory device 2630, and multiple optical links 2610a and 2610b configured to interconnect the controller 2620 and the resistive memory device 2630. The controller 2620 includes a control unit 2621, a first transmitter 2622, and a first receiver 2623. The control unit 2621 may transmit a control signal SN1 to the first transmitter 2622.

The first transmitter 2622 includes a first optical modulator 2622_1, which converts the control signal SN1, which is an electric signal, into a first optical transmission signal OPT1, and transmits the first optical transmission signal OPT1 to the optical link 2610a. The first receiver 2623 includes a first optical demodulator 2623_1, which converts a second optical receiving signal OPT2' received from the optical link 2610b into a data signal SN2, which is an electric signal, and transmits the data signal SN2 to the control unit 2621.

The resistive memory device 2630 include a second receiver 2631, a resistive memory cell array 2632, and a second transmitter 2633. The second receiver 2631 includes a second optical demodulator 2631_1, which converts a first optical receiving signal OPT1' received from the optical link 2610a into the control signal SN1, which is the electric signal, and transmits the control signal SN1 to the resistive memory cell array 2632.

In the resistive memory cell array 2632, data is may be written under the control of the control signal SN1, or the data signal SN2 output by the resistive memory cell array 2632 may be transmitted to the second transmitter 2633. The second transmitter 2633 includes a second optical modulator 2633_1, which converts the data signal SN2, which is the electric signal, into a second optical data signal OPT2, and transmits the second optical data signal OPT2 to the optical link 2610b.

Figure 19:
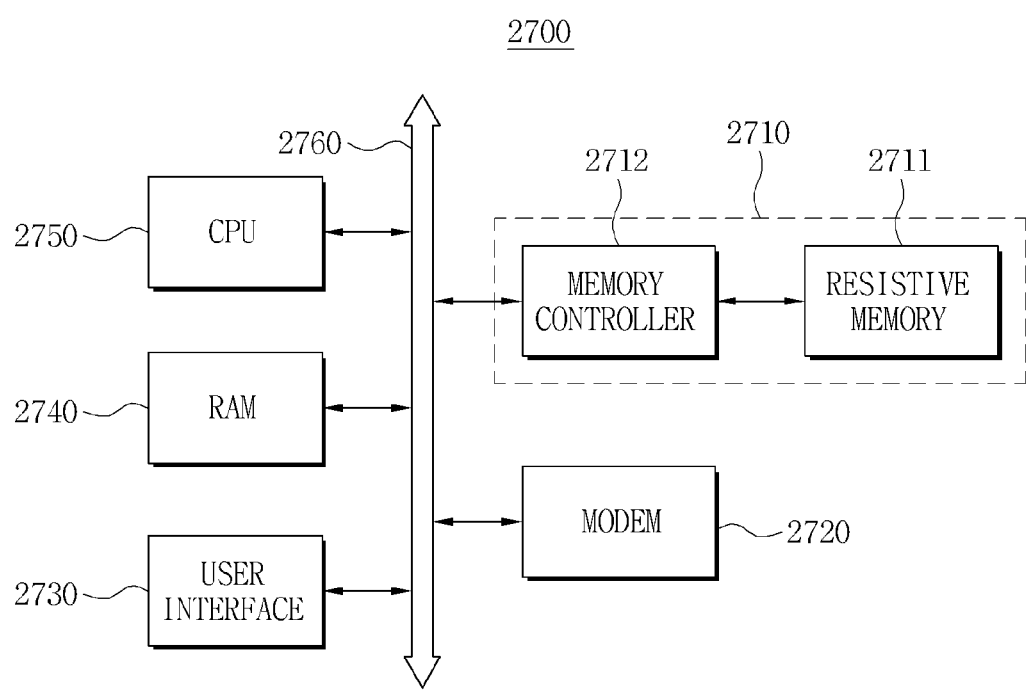
FIG. 19 is a block diagram of an example of an information processing system including a resistive memory device, according to an embodiment of the inventive concept.

FIG. 19 is a block diagram of an example of an information processing system including a resistive memory device, according to an embodiment of the inventive concept.

Referring to FIG. 19, an information processing system 2700 includes a memory system 2710, a modem 2720, a central processing unit (CPU) 2750, RAM 2740, and a user interface 2730, which may be electrically connected to a system bus 2760.

The memory system 2710 includes a resistive memory device 2711 and a memory controller 2712. The resistive memory device 2711 may be mounted in a computer system, such as a mobile device or a desktop computer, for example. Data processed by the CPU 2750 or externally input data may be stored in the resistive memory device 2711.

A semiconductor memory device including STT-MRAM cells may be incorporated as at least one of the resistive memory device 2711 and the RAM 2740. That is, the semiconductor memory device including STT-MRAM cells may be incorporated as the resistive memory device 2711, having significant capacity and thus configured to store a large amount of data required for the information processing system 2700, or as the RAM 2740 configured to store data (i.e., system data) that needs to be rapidly accessed. Although not shown in FIG. 19, it would be apparent to those of ordinary skill in the art that an application chipset, a camera image processor (CIP), and/or an input/output (I/O) device may be further provided in the information processing system 2700.

Among resistive memory devices, an STT-MRAM may be an advanced memory that may satisfy low-cost large-capacity characteristics of a dynamic RAM (DRAM), operation speed of a static RAM (SRAM), and non-volatile characteristics of a flash memory. Accordingly, while a conventional system requiring an additional cache memory with high processing speed and additional mass storage (e.g., RAM) configured to store a large amount of data, the cache memory and the mass storage may be replaced by an MRAM device, according to an embodiment of the inventive concept. That is, since a memory device including MRAM may rapidly store a large amount of data, an information processing system may be configured more simply than in the conventional art.

The resistive memory device according to embodiments of the inventive concept is able to compensate for resistance distribution of resistive devices included in a memory cell array and to increase sensing margin of data. Embodiments of the inventive concept may be applied to a semiconductor device, and more particularly, to a resistive memory device and a memory system including the same.

While the inventive concept has been described with reference to illustrative embodiments, it will be apparent to those skilled in the art that various changes and modifications may be made without departing from the spirit and scope of the present inventive concept. Accordingly, all such modifications are intended to be included within the scope of this inventive concept. Therefore, it should be understood that the above embodiments are not limiting, but illustrative.

What is claimed is:

1. A resistive memory device, comprising:
a memory cell array including a plurality of unit memory cells, and operating in response to a word line driving signal and a column selecting signal, each of the unit memory cells including a resistive device and a compensation resistive device, the resistive device and the compensation resistive device electrically connected in series between a word line to which the word line driving signal is applied and a bit line to which the column selecting signal is applied;
an input/output (I/O) sense amplifier unit configured to amplify data output from the memory cell array to generate first data, and to transfer input data to the memory cell array;
an address input buffer configured to generate a row address signal and a column address signal based on an external address;
a row decoder configured to decode the row address signal and to generate the word line driving signal based on the decoded row address signal; and
a column decoder configured to decode the column address signal and to generate the column selecting signal based on the decoded column address signal.

2. The device of claim 1, wherein the resistive device comprises:
a top electrode;
a bottom electrode; and
a transition metal oxide disposed between the top electrode and the bottom electrode.

3. The device of claim 1, wherein the resistive device comprises:
a top electrode;
a bottom electrode; and
phase-change material disposed between the top electrode and the bottom electrode.

4. The device of claim 1, wherein the resistive device comprises:
a free layer comprising a first ferromagnetic material;
a pinned layer comprising of a second ferromagnetic material; and
a tunnel barrier layer disposed between the free layer and the pinned layer.

5. The device of claim 1, wherein:
the memory cell array comprises a plurality of word lines and a plurality of bit lines, the unit memory cells being disposed between respective word lines and respective bit lines; and
the I/O sense amplifier unit comprises:
a selection circuit configured to selectively connect the bit lines of the memory cell array to a first node in response to the column selecting signal;
a sense amplifier configured to amplify a difference between a voltage signal of the first node and a reference voltage to generate first data; and
a write driver configured to generate a first program current based on write data and to provide the first program current to the first node in a normal operating mode, and configured to generate a second program current based on the first data and to provide the second program current to the first node in a test mode.

6. The device of claim 5, wherein the I/O sense amplifier unit further comprises:
a switch configured to selectively connect the first node to the sense amplifier and the write driver.

7. The device of claim 5, wherein the write driver is configured to compare the first data with a target value to determine a magnitude of the second program current.

8. The device of claim 1, wherein each unit memory cell further comprises:
a cell transistor having a gate connected to the word line, a source connected to a source line, and a drain connected to one of the resistive device or the compensation resistive device, wherein the other of the resistive device or the compensation resistive device is connected to the bit line.

9. The device of claim 1, wherein:
the memory cell array comprises a plurality of word lines and a plurality of bit lines, the unit memory cells being disposed between respective word lines and respective bit lines; and
the I/O sense amplifier unit comprises:
a selection circuit configured to selectively connect the bit lines of the memory cell array to a first node in response to the column selecting signal;
a sense amplifier configured to amplify a difference between a voltage signal of the first node and a reference voltage to generate first data; and
a write driver configured to generate a program current based on write data and to provide the program current to the first node in a normal operating mode, and configured to generate a program voltage based on the first data and to provide the program voltage to the compensation resistive device of a unit memory cell in a test mode.

10. The device of claim 9, wherein the write driver is configured to compare the first data with a target value to determine a magnitude of the program voltage.

11. The device of claim 9, wherein the compensation resistive device includes a floating gate transistor.

12. The device of claim 11, wherein the write driver is configured to change a magnitude of a threshold voltage (Vth) of the floating gate transistor according to the program voltage.

13. The device of claim 11, wherein the I/O sense amplifier unit further comprises:

a first switch configured to selectively connect the first node to the sense amplifier and the write driver; and a second switch configured to selectively connect the write driver to the first switch and a control gate of the floating gate transistor.

14. The device of claim 1, wherein the resistive memory device further comprises:

an input/output (I/O) circuit configured to determine an output order of the first data and to perform a parallel-serial conversion to generate output data, and configured to buffer the input data to provide to the I/O sense amplifier unit.

15. The device of claim 1, wherein the resistive memory device is a stacked memory device in which a plurality of chips communicate data and control signals by a through-silicon-via (TSV).

16. A method of compensating resistance distribution of a resistive device included in a memory cell array, the method comprising:

selecting a unit memory cell of the memory cell array, the memory cell comprising a resistive device and a compensation resistive device;

reading data from the selected unit memory cell;

determining whether the data read from the unit memory cell is equal to a target value; and when the read data is not equal to the target value, performing an offset write operation and again performing the reading of the data from the selected unit memory cell, wherein the offset write operation provides at least one of a program current and a program voltage to the selected unit memory cell in a test mode to adjust resistance of the compensation resistive device.

17. The method of claim 16, further comprising:

ending when the read data is equal to the target value.

18. A resistive memory device, comprising:

a memory cell array including a plurality of unit memory cells connected between a plurality of word lines and a plurality of bit lines, respectively, each unit memory cell comprising a cell transistor, a resistive device and a compensation resistive device, the cell transistor having a gate connected to a corresponding word line of the plurality of word lines, and the resistive device and the compensation resistive device being connected in series between the cell transistor and a corresponding bit line of the plurality of bit lines; and an input/output (I/O) sense amplifier unit configured to amplify data output from the memory cell array to generate first data, and to transfer input data to the memory cell array, wherein each compensation resistive device compensates a resistance distribution of a corresponding resistive device based on the first data, increasing an effective sensing margin of the resistive device.

19. The device of claim 18, wherein the I/O sense amplifier unit comprises:

a selection circuit configured to selectively connect the bit lines of the memory cell array to a first node;

a sense amplifier configured to amplify a difference between a voltage signal of the first node and a reference voltage to generate the first data; and a write driver configured to generate a first program current based on write data and to provide the first program current to the first node in a normal operating mode, and configured to generate a second program current based on the first data and to provide the second program current to the first node in a test mode.

20. The device of claim 18, wherein the I/O sense amplifier unit comprises:

a selection circuit configured to selectively connect the bit lines of the memory cell array to a first node;

a sense amplifier configured to amplify a difference between a voltage signal of the first node and a reference voltage to generate the first data; and a write driver configured to generate a program current based on write data and to provide the program current to the first node in a normal operating mode, and configured to generate a program voltage based on the first data and to provide the program voltage to the compensation resistive device of a unit memory cell in the memory cell array in a test mode.

* * * * *